(12) United States Patent
Mimino

(10) Patent No.: US 8,044,514 B2  
(45) Date of Patent: Oct. 25, 2011

(54) SEMICONDUCTOR INTEGRATED CIRCUIT

(75) Inventor: Yutaka Mimino, Kyoto (JP)

(73) Assignee: Rohm Co., Ltd. (JP)

( * ) Notice: Subject to any disclaimer, the term of this patent is extended or adjusted under 35 U.S.C. 154(b) by 43 days.

(21) Appl. No.: 12/394,982

(22) Filed: Feb. 27, 2009

(65) Prior Publication Data  
US 2009/0212445 A1 Aug. 27, 2009

(30) Foreign Application Priority Data  
Feb. 27, 2008 (JP) .................. 2008-046315

(51) Int. Cl.  
H01L 23/48 (2006.01)  
H01L 23/52 (2006.01)  
H01L 29/40 (2006.01)  
(52) U.S. Cl. .................. 257/768; 257/E23.142; 333/246  
(58) Field of Classification Search .................. 257/786, 257/E23.142; 333/246  
See application file for complete search history.

(56) References Cited

U.S. PATENT DOCUMENTS

| | | | |
|---|---|---|---|
| 6,967,557 B2 * | 11/2005 | Hagios et al. ................. | 336/200 |
| 7,094,624 B2 * | 8/2006 | Park et al. ........................ | 438/82 |
| 7,217,370 B2 * | 5/2007 | Sugimoto et al. ............... | 216/17 |
| 7,973,245 B2 * | 7/2011 | Muramatsu et al. ........... | 174/260 |
| 2004/0211590 A1 * | 10/2004 | Tagi et al. ...................... | 174/255 |
| 2009/0079523 A1 * | 3/2009 | Hsu ................................ | 333/246 |

FOREIGN PATENT DOCUMENTS  
JP 4-291803 A 10/1992  
* cited by examiner

Primary Examiner — Phuc Dang  
(74) Attorney, Agent, or Firm — Cantor Colburn LLP

(57) ABSTRACT

In a semiconductor integrated circuit, a second wiring layer includes a ground conductor having at least one opening formed therein. At least one opening is overlapped by at least one patch conductor included in a third wiring layer. At least one patch conductor and the ground conductor are electrically connected to each other by at least one via hole included in a second dielectric layer. A first wiring layer includes a signal line above the ground conductor.

7 Claims, 5 Drawing Sheets

SEMICONDUCTOR INTEGRATED CIRCUIT

BACKGROUND OF THE INVENTION

1. Field of the Invention

The present invention relates to a semiconductor integrated circuit including a high-frequency circuit.

2. Description of the Related Art

In a semiconductor integrated circuit, because of good compatibility with a wiring process, a microstrip line is preferably used as a means which transmits a high-frequency signal.

The microstrip line has a structure in which a signal line, a dielectric layer, and a ground layer are laminated in the order named.

As a conventional ground layer, one metal thin film formed on a substrate is used. In order to obtain an excellent high-frequency characteristic for the microstrip line, the metal thin film which is flat and large as much as possible is desired.

However, in general, a metal thin film formed on a substrate of a semiconductor integrated circuit is very thin. When the area of the metal thin film is increased, cracks or peeling may be frequently caused by mechanical stress.

Therefore, in a conventional technique, some openings to get mechanical stress away from the mechanical thin film are formed in the metal thin film. In order to get the stress away, the openings are desirably arranged as densely as possible. Therefore, the openings are generally arranged in a zigzag pattern.

[Patent Document 1] Japanese Patent Application Laid-Open No. 4-291803

In this case, when the openings are arranged in a zigzag pattern, because of the arrangement shape, signal lines are very difficult to be arranged to avoid positions immediately above the openings. Therefore, the signal lines are arranged immediately above several openings.

When, in particular, a high-frequency signal electric current flows in the signal lines, an electric current is inducted from the grounded metal thin film, and the induced current flows in the metal thin film along the signal lines. When the induced current reaches an opening, the current flows along the circumference of the opening to increase a signal loss disadvantageously.

Since the metal thin film is not formed under the signal lines near the opening, an impedance becomes discontinuous, the signal lines have deteriorated characteristics to, especially, a high-frequency signal.

With respect to this problem, the arrangement of the openings may be changed to prevent the openings from being arranged along the signal lines. However, this breaks the regularity of the arrangement of the openings, and the number of operation processes in a design phase of a semiconductor integrated circuit considerably increases. Depending on circumstances, it is impossible to make such a change in a design rule.

SUMMARY OF THE INVENTION

The present invention has been made in consideration of the problems, and has, as its general purpose, to provide a technique to configure a low-loss and uniform ground layer in a semiconductor integrated circuit.

An embodiment of the present invention relates to a semiconductor integrated circuit. The semiconductor integrated circuit includes a first wiring layer, a first dielectric layer arranged adjacent to the first wiring layer, and a ground layer arranged adjacent to a surface of the first dielectric layer opposing a surface to which the first wiring layer is adjacent. The ground layer includes a second wiring layer including a ground conductor having at least one opening formed therein, a second dielectric layer arranged adjacent to the second wiring layer, and a third wiring layer arranged adjacent to a surface of the second dielectric layer opposing a surface to which the second wiring layer is adjacent. The third wiring layer includes at least one patch conductor each of which overlaps the corresponding opening and is electrically connected to the ground conductor by at least one via hole included in the second dielectric layer.

According to this embodiment, since the opening of the ground conductor is covered with the patch conductor having a ground potential, electric nonuniformity of the ground conductor with reference to the first wiring layer is reduced.

The first wiring layer may include a signal line arranged in a region overlapping the ground conductor.

A loss of a signal current flowing in the signal line is reduced.

Another embodiment of the present invention is also a semiconductor integrated circuit. This semiconductor integrated circuit includes a first wiring layer, a first dielectric layer arranged adjacent to the first wiring layer, and a ground layer arranged adjacent to a surface of the first dielectric layer opposing a surface to which the first wiring layer is adjacent. The ground layer includes a second wiring layer including a plurality of conductors which are arranged at intervals and at least one of which is grounded, a second dielectric layer arranged adjacent to a surface of the second wiring layer, and a third wiring layer arranged adjacent to a surface of the second dielectric layer opposing a surface to which the second wiring layer is adjacent. The third wiring includes at least one patch conductor each of which overlaps the corresponding gap. Each of the at least one patch conductor is electrically connected to the conductor being in contact with the corresponding gap by at least one via hole included in the second dielectric layer.

According to the embodiment, all the plurality of conductors are electrically connected to each other by the via hole and the patch conductor. Therefore, work and time for connecting the plurality of conductors to each other can be saved, and the number of operation processes in a design phase of a semiconductor integrated circuit.

Since the gap is covered with the patch conductor having a ground potential, electric nonuniformity of the ground conductor is reduced with reference to the first wiring layer.

The plurality of conductors may be rectangular and may be arranged at predetermined intervals in one direction.

The plurality of conductors have simple shapes, respectively, and regularly arranged to make it easy to form the second wiring layer and to make it possible to reduce the number of operation processes in a design phase of a semiconductor integrated circuit.

The plurality of conductors may be arranged in the form of a matrix.

The plurality of conductors have simple shapes, respectively, and regularly arranged to make it easy to form the second wiring layer and to make it possible to reduce the number of operation processes in a design phase of a semiconductor integrated circuit.

The first wiring layer may include a signal line arranged in a region overlapping at least one of the plurality of conductors.

A loss of a signal current flowing in the signal line is reduced.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

The present invention is preferably used in an integrated circuit or the like which handles a high-frequency signal having, in particular, several hundred megahertz or more. For example, the present invention can be used in a high-frequency circuit unit of, for example, an integrated circuit for a mobile phone. The present invention can also be applied to a high-frequency circuit unit for a wireless Local Area Network (LAN), a Bluetooth, a Ultra Wide Band (UWB), a satellite broadcasting tuner, or the like.

First Embodiment

Figure 1:
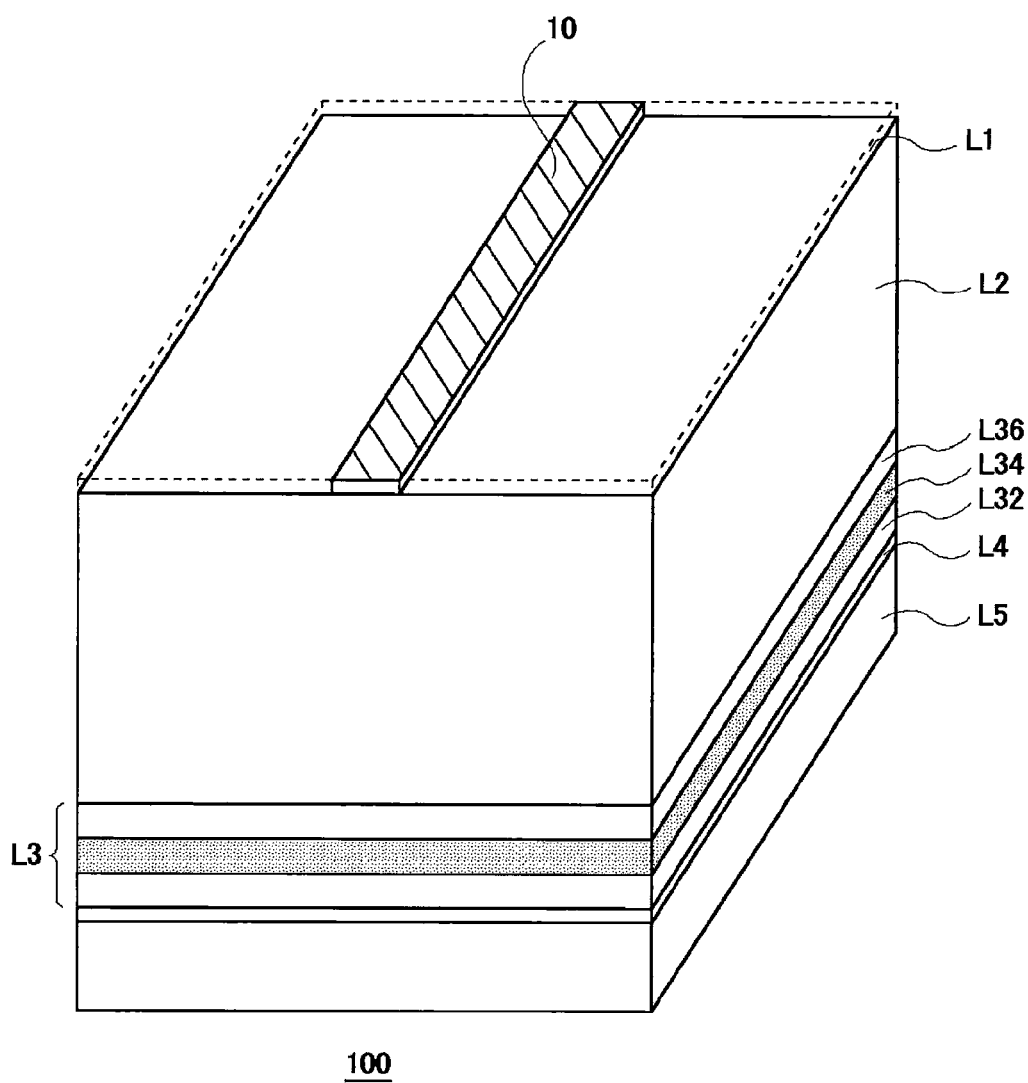
FIG. 1 is a perspective view showing a configuration of a semiconductor integrated circuit according to a first embodiment.

FIG. 1 is a perspective view showing a frame format of a configuration of a semiconductor integrated circuit 100 according to a first embodiment of the present invention. The semiconductor integrated circuit 100 includes a signal line 10 included in an wiring layer L1, a first dielectric layer L2, a ground layer L3, an insulating layer L4, and a semiconductor substrate L5. For example, the signal line 10, the first dielectric layer L2, and the ground layer L3 may constitute a microstrip line. The ground layer L3 includes a laminate structure configured by a second wiring layer L32, a second dielectric layer L34, and a third wiring layer L36.

Figure 2:
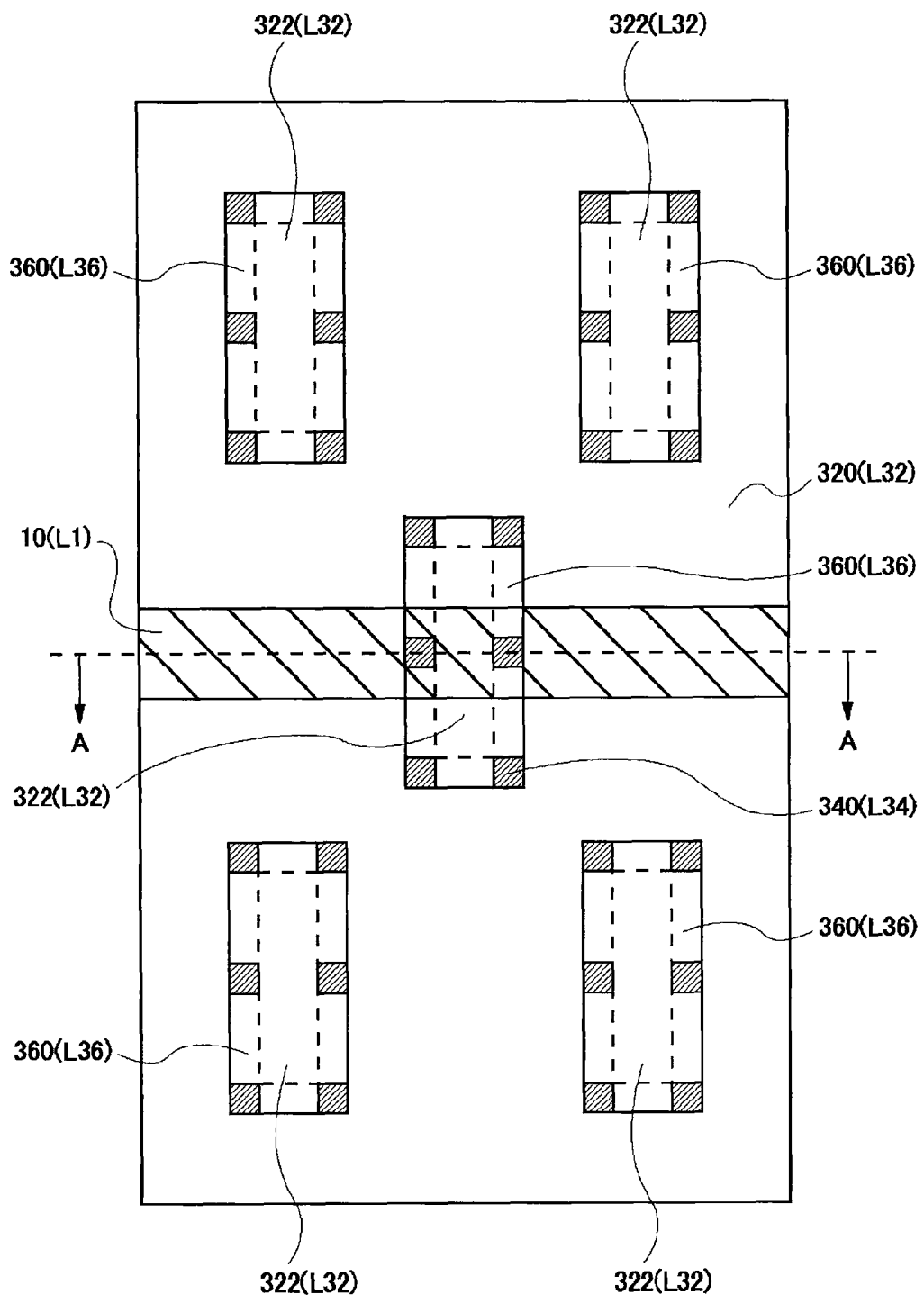
FIG. 2 is a plan overhead view showing the semiconductor integrated circuit according to the first embodiment.

FIG. 2 is a plan overhead view of the semiconductor integrated circuit 100. In a ground conductor 320 included in the second wiring layer L32, openings 322 are formed in a zigzag pattern. In FIG. 2, the openings 322 are shown as a region surrounded by a broken line. The openings 322 are overlapped by a patch conductors 360 included in the third wiring layer L36. The patch conductors 360 and the ground conductor 320 are electrically connected to each other through a via hole 340 formed in the second dielectric layer L34. Above the ground conductor 320, the signal line 10 is arranged to pass through a position immediately above the openings 322.

Layers including members are shown in parentheses added next to reference numerals in FIG. 2.

For example, the signal line 10, the via hole 340, the ground conductor 320, and the patch conductors 360 may consist of a metal such as aluminum, gold, or copper. The first dielectric layer L2, the second dielectric layer L34, and the insulating layer L4 may contain a silicon compound such as silicon dioxide, silicon nitride or a resin such as polyimide.

For example, the dimensions of the opening 322 are 5 μm in a longitudinal direction and 2 μm in a lateral direction. The dimensions of an interval between the openings 322 may be 10 μm in, for example, the longitudinal direction and the lateral direction each.

FIGS. 3A to 3D are sectional views showing semiconductor integrated circuits according to the embodiment and a modification thereof.

Figure 3A:
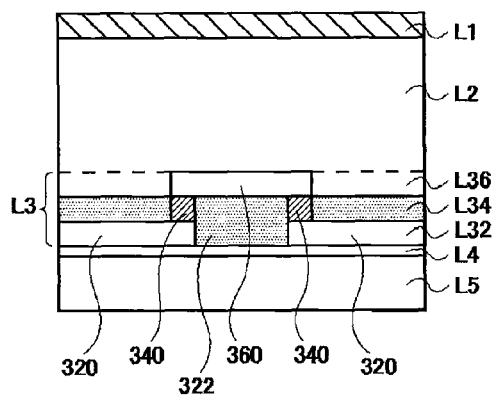
FIGS. 3A to 3D are sectional views showing semiconductor integrated circuits according to the first embodiment and a modification thereof.

FIG. 3A is a sectional view along an A-A line in FIG. 2. In the embodiment, the patch conductors 360 are arranged to the ground conductor 320 on the first wiring layer L1 side. The openings 322 are filled with the same material as the dielectric material forming the second dielectric layer L34. The third wiring layer L36 except for the patch conductors 360 is filled with the same material as the dielectric material forming the first dielectric layer L2.

According to the configuration of the semiconductor integrated circuit 100 according to the embodiment, when a current induced in the ground conductor 320 by a signal current flowing in the signal line 10 reaches a position near the openings 322, the current flows in the via holes 340 and the patch conductors 360 but the peripheries of the openings 322. In this manner, a loss caused by the openings 322 can be reduced.

Since the openings 322 of the ground conductor 320 are covered with the patch conductors 360 having a ground potential, electric nonuniformity of the ground conductor 320 is reduced with reference to the first wiring layer L1.

The embodiment contributes to a reduction in loss and a reduction in impedance mismatch especially when the signal line 10 handles a high-frequency signal.

The above effect is conspicuous especially when a thickness of the first dielectric layer L2 is larger than a thickness of the ground layer L3. For example, the thickness of the first dielectric layer may be set to about 9 μm, and the thickness of the ground layer may be set to about 1.5 μm. A width of the signal line 10 may be set to, for example, about 10 μm.

Since the degree of remaining impedance mismatch is small in the embodiment, fine adjustment can be performed by a simple method. For example, a width of a portion overlapping the patch conductor 360 on the signal line 10 is appropriately adjusted to make it possible to perform impedance matching at higher accuracy.

Figure 3B:
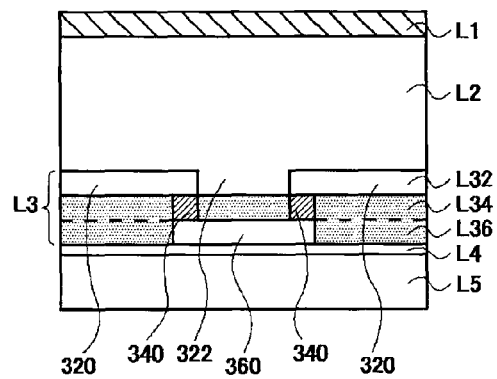

FIG. 3B is a sectional view showing a modification of the ground layer L3. In a configuration shown in FIG. 3B, the second wiring layer L32 and the third wiring layer L36 in FIG. 3A are replaced with each other. The openings 322 are filled with the same material as the dielectric material forming the first dielectric layer L2. The third wiring layer L36 except for the patch conductors 360 is filled with the same material as the dielectric material forming the second dielectric layer L34.

Figure 3C:
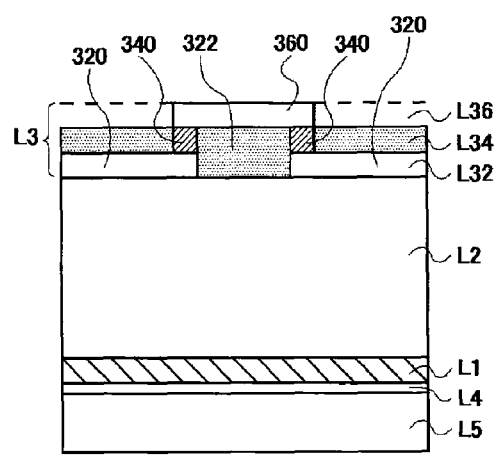
Figure 3D:
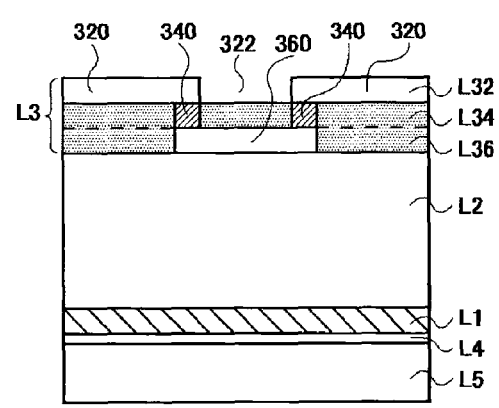

FIGS. 3C and 3D are modifications about orders of laminated layers of the semiconductor integrated circuit 100. In FIGS. 3C and 3D, the first wiring layer L1 is arranged on the semiconductor substrate L5 side. The ground layer L3 in FIG. 3C has the same configuration as that of the ground layer L3 in FIG. 3A except that the third wiring layer L36 except for the patch conductors 360 are not filled. The ground layer L3 in FIG. 3D has the same configuration as that of the ground layer L3 in FIG. 3B except that the openings 322 are not filled.

According to the modifications in FIGS. 3B to 3D, in addition to the effects in the first embodiment, the degree of flatness of the ground conductor 320 can be more increased.

Second Embodiment

Figure 4A:
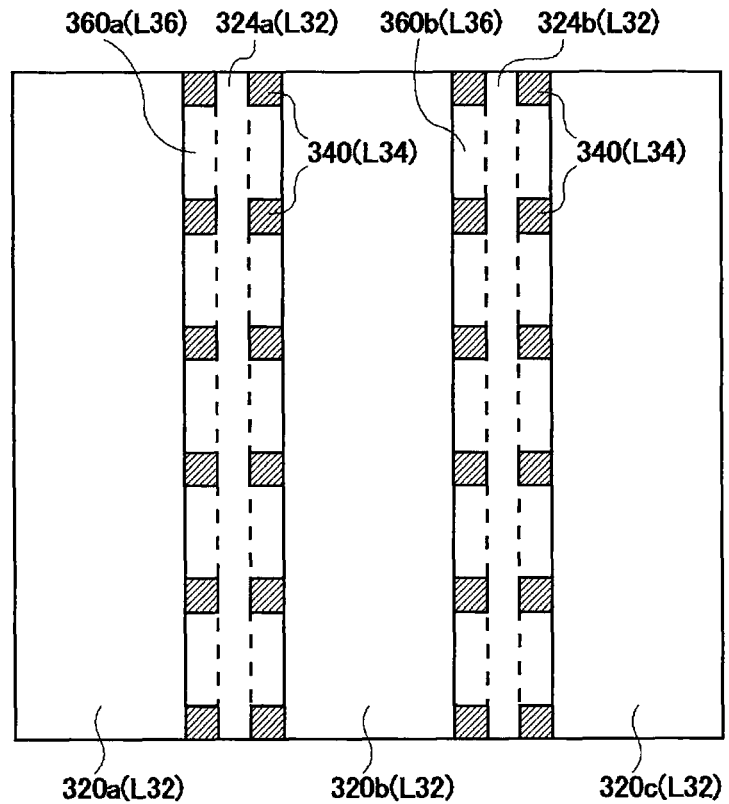
FIGS. 4A and 4B are plan overhead views showing ground layers of semiconductor integrated circuits according to a second embodiment and a modification thereof.
Figure 4B:
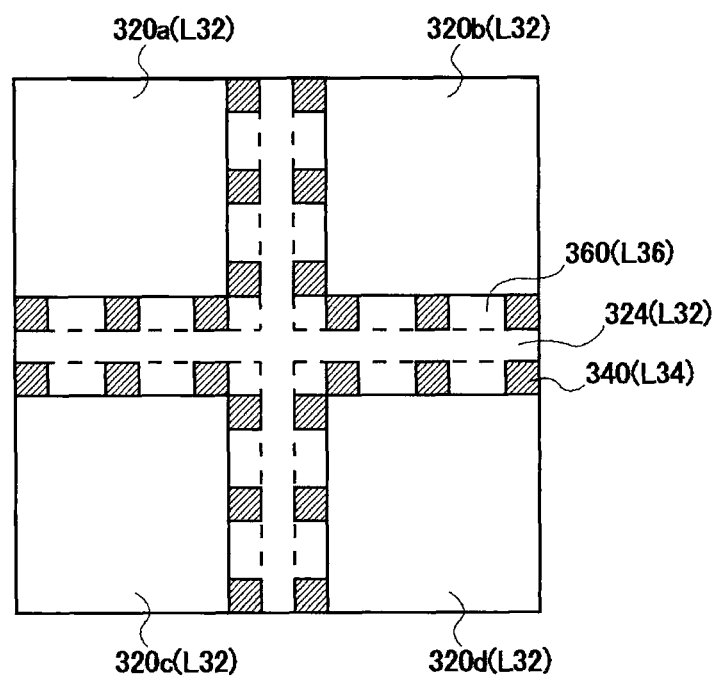

FIGS. 4A and 4B are plan overhead views of ground layers of semiconductor integrated circuits according to a second embodiment and a modification thereof. The semiconductor integrated circuits have a similar configurations as that in FIG. 1.

Layers including members are shown in parentheses added next to reference numerals in FIGS. 4A and 4B.

FIG. 4A is a plan overhead view showing the ground layer of the semiconductor integrated circuit according to the second embodiment. The second wiring layer L32 includes a plurality of conductors 320a to 320c. Gaps 324a and 324b formed between the plurality of conductors 320a to 320c are overlapped by patch conductors 360a and 360b included in the third wiring layer L36. The patch conductors 360a and 360b and the plurality of conductors 320a to 320c are electrically connected to each other through a via hole 340 formed in the second dielectric layer L34. In this manner, the conductors 320a to 320c form one ground conductor.

According to the ground layer of the semiconductor integrated circuit according to the second embodiment, since conductors such as the plurality of conductors 320a to 320c having simple shapes can be easily designed, the number of operations processes in a design phase of a semiconductor integrated circuit can be reduced. The plurality of conductors 320a to 320c are regularly arranged to make it easy to design the semiconductor integrated circuit and to make it possible to reduce the number of operation processes in the design phase of the semiconductor integrated circuit.

When currents induced in the plurality of conductors 320a to 320c by a signal current in the first wiring layer L1 reaches the gaps 324a and 324b, the currents flow in the patch conductors 360a and 360b through the via holes 340, respectively. In this manner, losses caused by the gaps 324a and 324b can be reduced.

Furthermore, since the gaps 324a and 324b are covered with the patch conductors 360a and 360b having a ground potential, electric nonuniformity of the plurality of conductors 320a to 320c id reduced with reference to the first wiring layer L1.

FIG. 4B is a plan overhead view showing a ground layer of a semiconductor integrated circuit according to a modification of the second embodiment. In this modification, a second wiring layer includes a plurality of conductors 320a to 320d. A gap 324 formed between the conductors 320a to 320d is overlapped by the patch conductors 360 included in the third wiring layer. The patch conductors 360 and the plurality of conductors 320a to 320d are electrically connected to each other through the via holes 340.

According to the modification, the same effect as that in the second embodiment can be obtained.

Third Embodiment

In the first and second embodiments, the circuits including wires such as a signal line are handled. However, in the third embodiment, in addition to the wire, a circuit element is incorporated.

Figure 5:
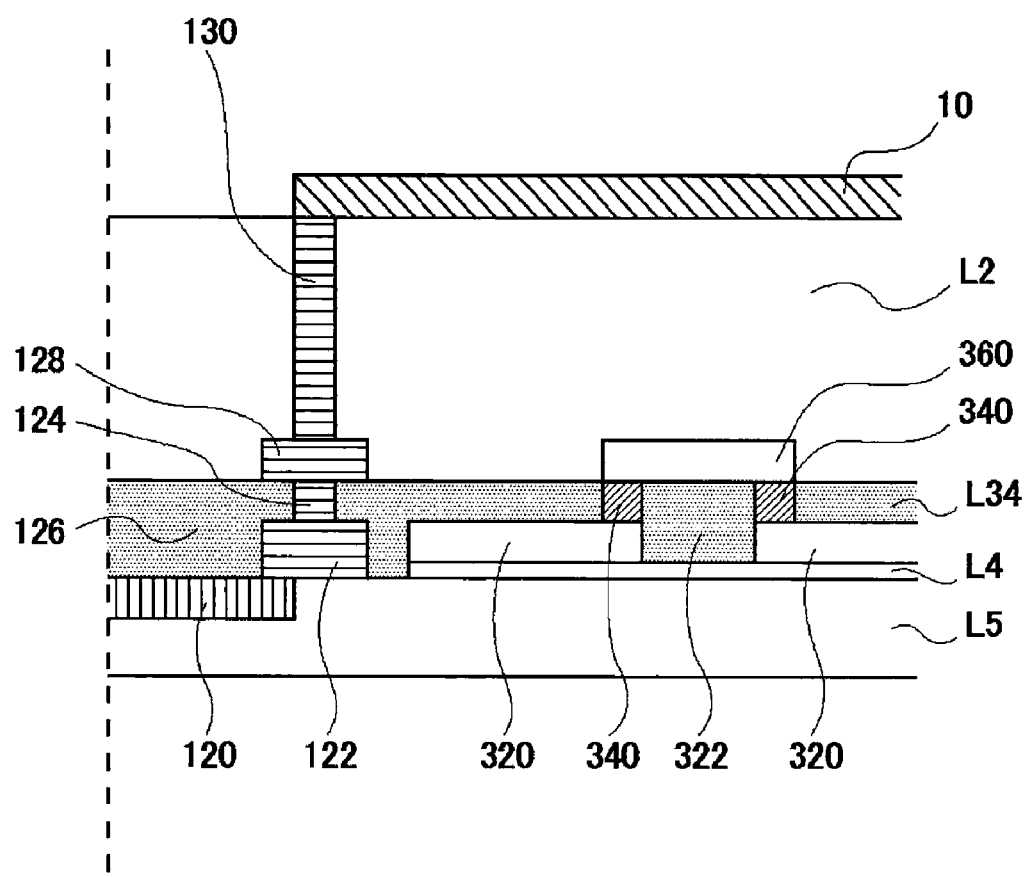
FIG. 5 is a sectional view of a semiconductor integrated circuit according to a third embodiment.

FIG. 5 is a sectional view of a semiconductor integrated circuit according to the third embodiment. In the ground conductor 320, in addition to the openings 322, an opening 126 which exposes a circuit element 120 is formed. In FIG. 5, half of the opening 126 is shown. As the circuit element 120, for example, an n-type impurity layer resistor formed by implanting ions in a part of the surface of the semiconductor substrate L5 may be used. However, the circuit element 120 may be a circuit element of another type, for example, a transistor, a capacitor, or the like. The circuit element 120 is electrically connected to the signal line 10 through an electrode 122, a via hole 124, a contact 128, and a via hole 130.

According to the configuration of the semiconductor integrated circuit according to the third embodiment, the circuit element 120 is arranged closer to the signal line 10, and noise and a loss can be reduced. The circuit element 120 is arranged in the ground conductor 320 to contribute to downsizing of an integrated circuit.

The embodiments described above are illustrations. It is conceived by a person skilled in the art that various modifications can be effected by combinations of the constituent elements and the handling processes of the embodiments and that the modifications are included in the spirit and scope of the invention.

The arrangement and the number of via holes 340 described in the embodiments are illustrations, and may be determined by an application, a size, and the like of a semiconductor integrated circuit. In particular, in order to keep electric conductivity high, as many via holes as possible are desirably formed if a process rule permits.

In each of the embodiments, one ground layer L3 is described. However, the present invention can be preferably applied to a case in which a plurality of ground layers like strip lines are formed. In particular, in the strip lines, at least one of two ground layers which sandwich a signal line may be configured by the ground layer according to the present invention.

In the embodiments, the configuration including the signal line 10, the dielectric layer L2, and the ground layer L3 is formed on the surface of the insulating layer L4. However, the present invention is not limited to the configuration. The configuration may be formed at any positions of the laminate structure of the semiconductor integrated circuit.

In the embodiments, the explanation is performed by using the signal line 10 as a wire included in the first wiring layer L1. The wire is not limited to the signal line 10. A wire which requires a ground layer such as an open stub, a short stub, or an inductor can be used. The first wiring layer L1 may include a circuit element.

While the preferred embodiments of the present invention have been described using specific terms, such description is for illustrative purposes only, and it is to be understood that changes and variations may be made without departing from the spirit or scope of the appended claims.

What is claimed is:

1. A semiconductor integrated circuit comprising:
a first wiring layer;
a first dielectric layer arranged adjacent to the first wiring layer; and
a ground layer arranged adjacent to a surface of the first dielectric layer opposing a surface to which the first wiring layer is adjacent, wherein
the ground layer includes
a second wiring layer including a ground conductor having a plurality of openings formed therein, the plurality of openings removing mechanical stress from the second wiring layer;

a second dielectric layer arranged adjacent to the second wiring layer, and a third wiring layer arranged adjacent to a surface of the second dielectric layer opposing a surface to which the second wiring layer is adjacent, and including a plurality of patch conductors each of which overlaps the corresponding opening, and each of the plurality of patch conductors is electrically connected to the ground conductor by at least one via hole included in the second dielectric layer.

2. The semiconductor integrated circuit according to claim 1, wherein the first wiring layer includes a signal line arranged in a region overlapping the ground conductor.

3. The semiconductor integrated circuit according to claim 1, wherein the plurality of openings are arranged in a zigzag pattern.

4. A semiconductor integrated circuit comprising:

a first wiring layer;

a first dielectric layer arranged adjacent to the first wiring layer; and a ground layer arranged adjacent to a surface of the first dielectric layer opposing a surface to which the first wiring layer is adjacent, wherein the ground layer includes a second wiring layer including a plurality of conductors which are arranged at intervals and at least one of which is grounded, the intervals removing stress from the second wiring layer, a second dielectric layer arranged adjacent to the second wiring layer, and a third wiring layer arranged adjacent to a surface of the second dielectric layer opposing a surface to which the second wiring layer is adjacent and including at least one patch conductor each of which overlaps the corresponding interval, and each of the at least one patch conductor is electrically connected to the conductor being in contact with the corresponding interval by at least one via hole included in the second dielectric layer.

5. The semiconductor integrated circuit according to claim 4, wherein the plurality of conductors are rectangular and are arranged at predetermined intervals in one direction.

6. The semiconductor integrated circuit according to claim 4, wherein the plurality of conductors are arranged in the form of a matrix.

7. The semiconductor integrated circuit according to claim 4, wherein the first wiring layer includes a signal line arranged in a region overlapping at least one of the plurality of conductors.

* * * * *